United States Patent
Kozakai et al.

(10) Patent No.: US 9,006,934 B2
(45) Date of Patent: Apr. 14, 2015

(54) POWER FEEDING APPARATUS, POWER RECEIVING APPARATUS, WIRELESS POWER FEEDING SYSTEM AND METHOD FOR WIRELESS TRANSFER OF POWER

(75) Inventors: Osamu Kozakai, Kanagawa (JP); Takashi Miyamoto, Chiba (JP); Yuji Murayama, Tokyo (JP)

(73) Assignee: Sony Corporation, Tokyo (JP)

( * ) Notice: Subject to any disclaimer, the term of this patent is extended or adjusted under 35 U.S.C. 154(b) by 881 days.

(21) Appl. No.: 13/080,375

(22) Filed: Apr. 5, 2011

(65) Prior Publication Data
US 2011/0248572 A1 Oct. 13, 2011

(30) Foreign Application Priority Data
Apr. 9, 2010 (JP) ................................ 2010-090079

(51) Int. Cl.
| H01F 27/42 | (2006.01) |
| H01F 37/00 | (2006.01) |
| H01F 38/00 | (2006.01) |
| H03F 1/56 | (2006.01) |

(52) U.S. Cl.
CPC ..................................... *H03F 1/565* (2013.01)

(58) Field of Classification Search
CPC ........... H02J 5/005; H02J 7/025; H02J 17/00; H01F 38/14; B60L 11/182
USPC ........... 307/104; 455/78, 83, 107, 121, 193.1, 455/562; 343/860, 745, 861, 700; 333/32, 333/17.3, 17, 124, 129, 132
See application file for complete search history.

(56) References Cited

U.S. PATENT DOCUMENTS

| 5,777,475 | A * | 7/1998 | Vester ............................ 324/322 |
| 6,526,263 | B1 * | 2/2003 | Saito .............................. 455/78 |
| 7,109,944 | B2 * | 9/2006 | Sato et al. .................... 343/860 |
| 7,633,355 | B2 * | 12/2009 | Matsuo ........................... 333/32 |

FOREIGN PATENT DOCUMENTS

| CN | 101662170 | 3/2010 |
| JP | 10-163889 | 6/1998 |
| WO | 2009/114671 | 9/2009 |

OTHER PUBLICATIONS

The State Intellectual Property Office of the People's Republic of China, Notification of the First Office Action issued in connection with P.R.C. Patent Application No. 2011100840246, dated Jun. 5, 2014. (17 pages).

* cited by examiner

*Primary Examiner* — Rexford Barnie
*Assistant Examiner* — Jagdeep Dhillon
(74) *Attorney, Agent, or Firm* — K&L Gates LLP

(57) ABSTRACT

A power feeding apparatus, power receiving apparatus, wireless power feeding system, and method for wireless transfer of power are provided. The power feeding apparatus includes an impedance detector, a controller, a power transmitter, a variable matching circuit, and a signal transmitter. The controller is configured to provide first control information and second control information based on an impedance detected by the impedance detector. The power feeding apparatus' variable matching circuit is configured to change a variable diameter of a power feeding coil according to the first control information. The power receiving apparatus includes a power receiver, a signal receiver, and a variable matching circuit. The power receiving apparatus' variable matching circuit is configured to change a variable diameter of a power feeding coil according to the second control information provided by the power feeding apparatus.

13 Claims, 16 Drawing Sheets

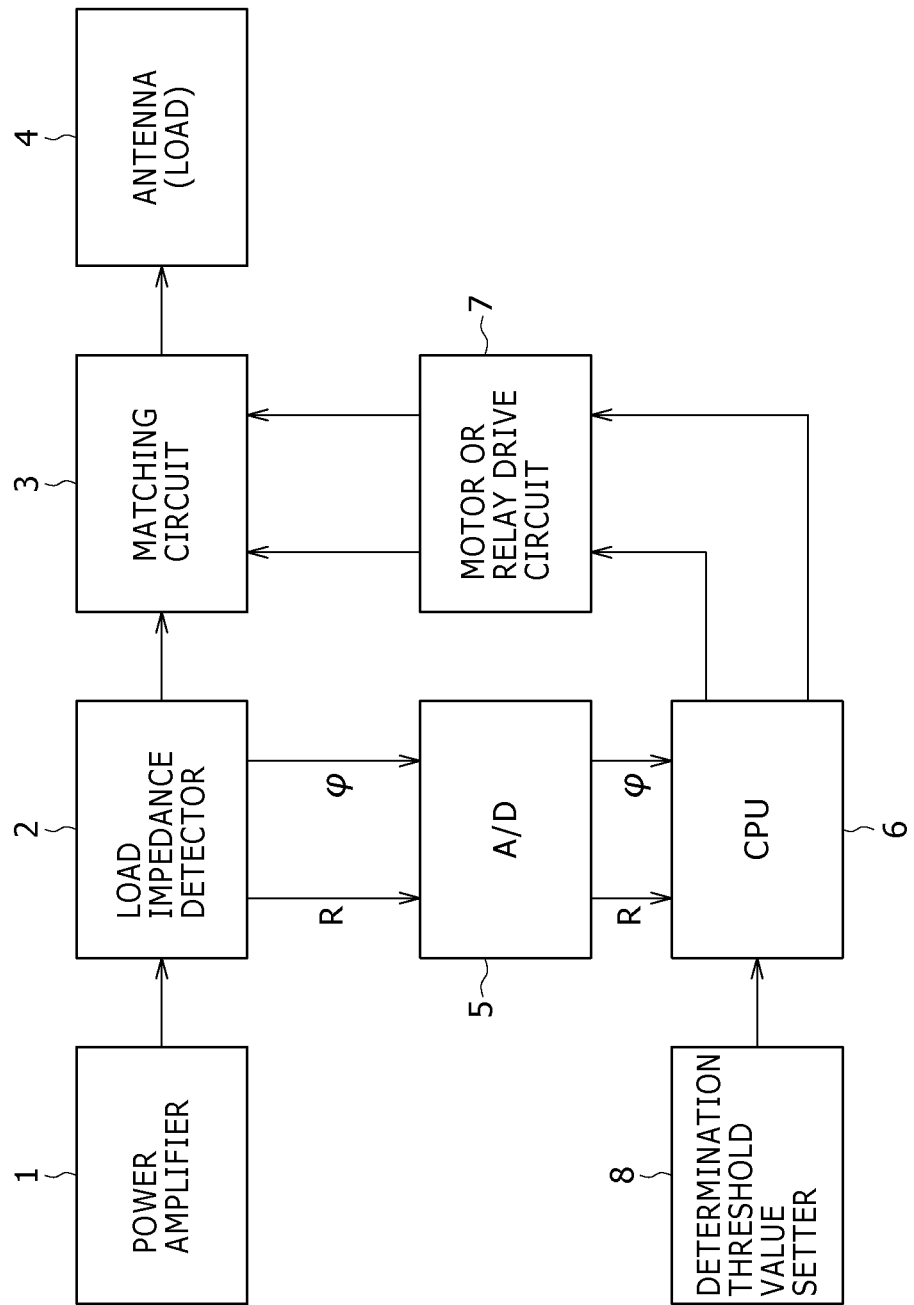
F I G. 1

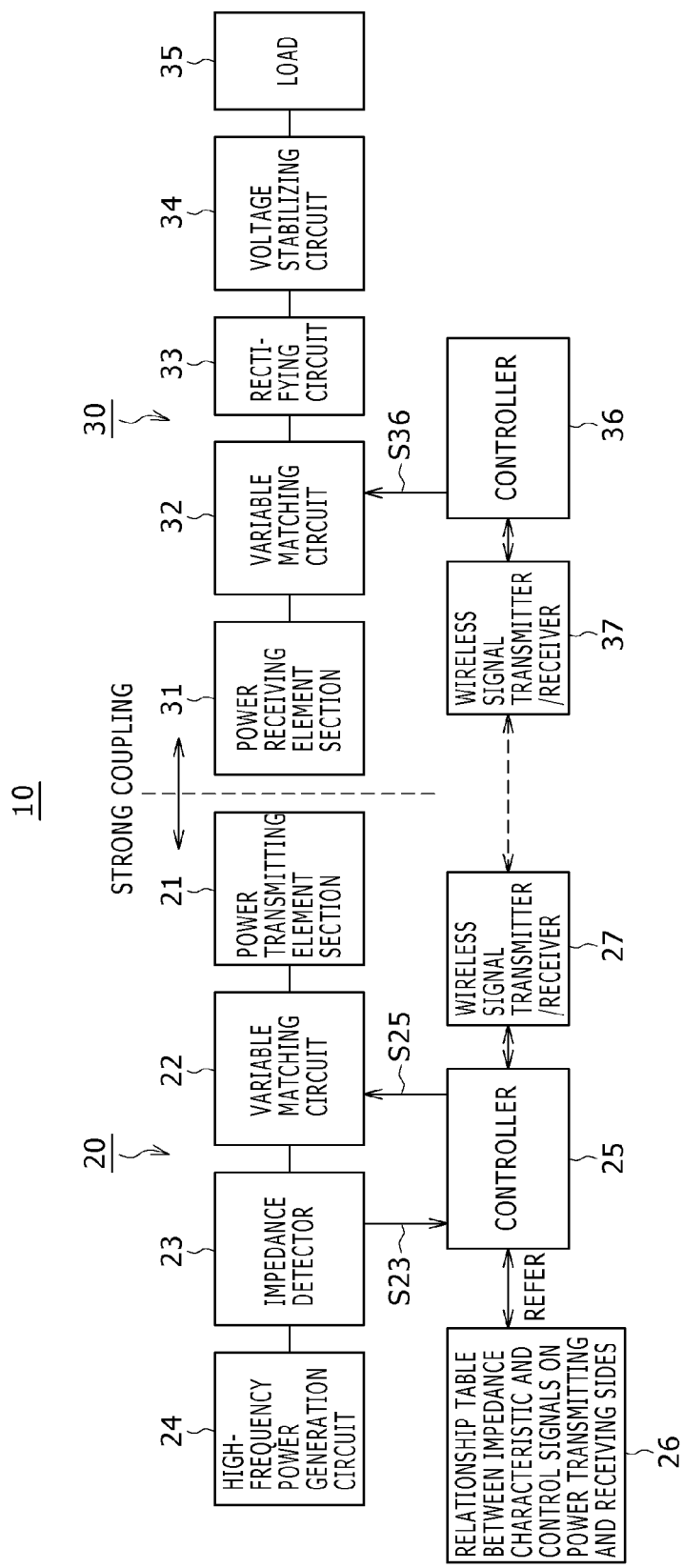
F I G . 3

F I G . 4
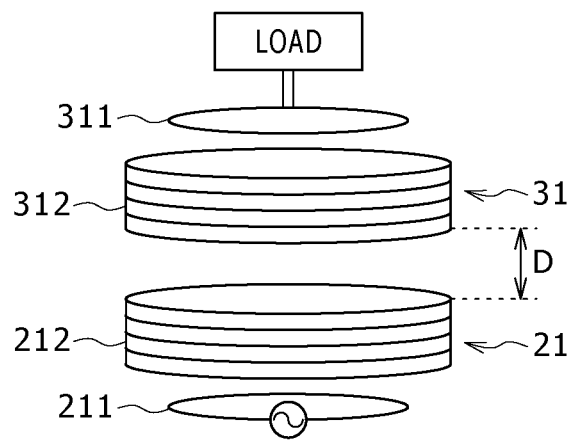

F I G . 5
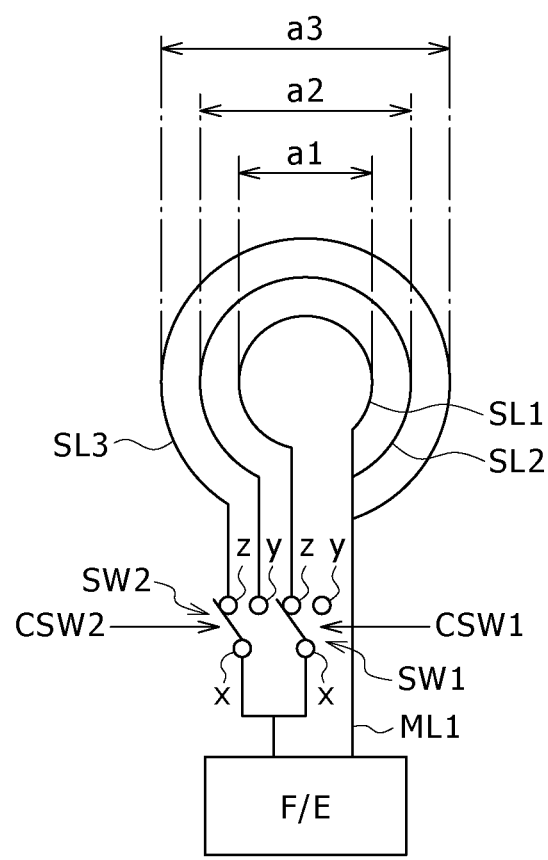

F I G . 6
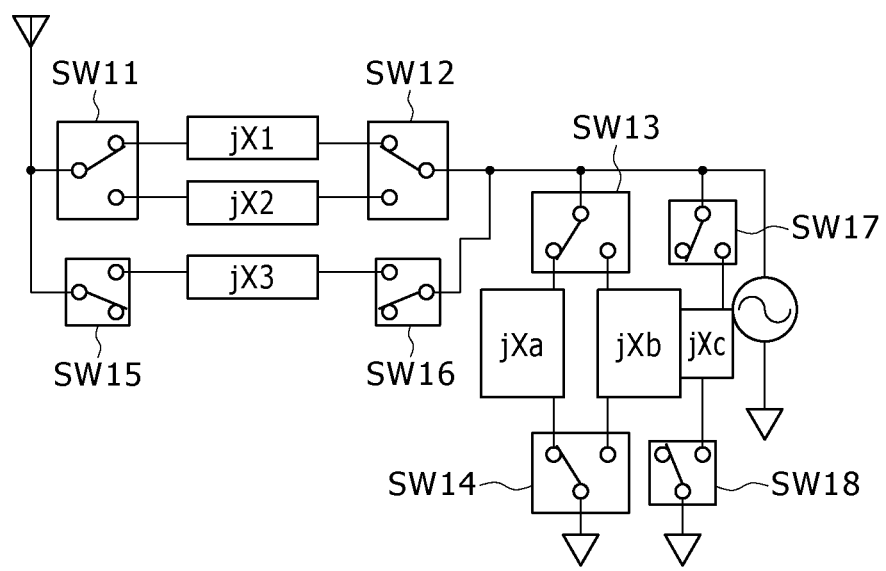

F I G. 9
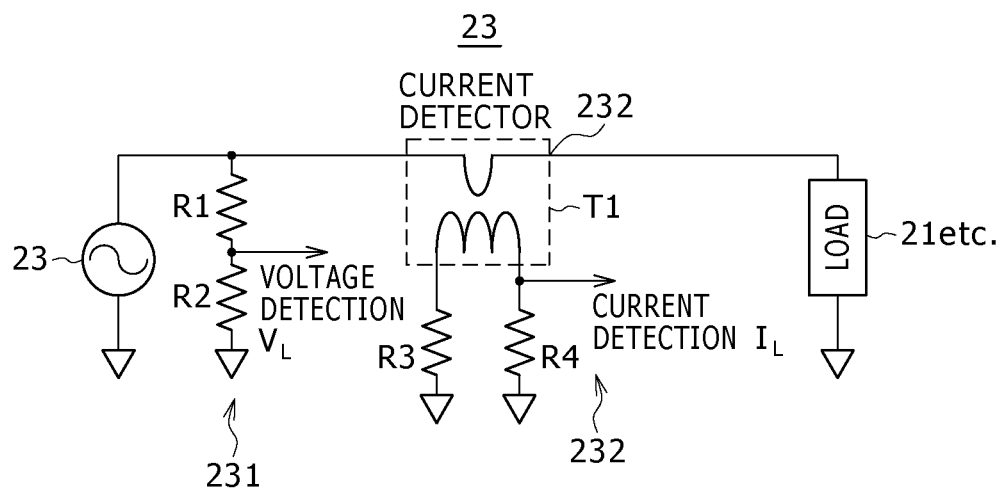

FIG.12

| CURRENT STATE OF IMPEDANCE ON POWER TRANSMITTING SIDE | CURRENT STATE OF VARIABLE IMPEDANCE MATCHER | | | |
|---|---|---|---|---|
| | ST1 | ST2 | ST3 | ST4 |
| 1ST & 4TH QUADRANTS | TO STATE 2 | TO STATE 3 | TO STATE 4 | NO CHANGE |
| 2ND & 3RD QUADRANTS | NO CHANGE | TO STATE 1 | TO STATE 2 | TO STATE 3 |

STATE TRANSITION TABLE TO BE REFERRED TO WHEN VSWR>3

POWER FEEDING APPARATUS, POWER RECEIVING APPARATUS, WIRELESS POWER FEEDING SYSTEM AND METHOD FOR WIRELESS TRANSFER OF POWER

CROSS REFERENCES TO RELATED APPLICATIONS

The present application claims priority to Japanese Patent Application JP 2010-090079, filed in the Japanese Patent Office on Apr. 9, 2010, the entire contents of which is being incorporated herein by reference

BACKGROUND

The present disclosure relates to a power feeding apparatus, power receiving apparatus, wireless power feeding system, and method for supplying and receiving power in a noncontact (wireless) manner.

The electromagnetic induction method is known to supply power wirelessly.

In recent years, attention has been focused on wireless power feeding and charging systems using a method called the magnetic field resonance method that relies on the electromagnetic resonance phenomenon.

The currently popular noncontact feeding method based on the electromagnetic induction method requires that the source and destination of power (power receiving side) have to share a magnetic flux. For efficient power transmission, the source and destination of power have to be arranged extremely close to each other. Further, coupling alignment is also essential.

On the other hand, the noncontact power feeding method based on the electromagnetic resonance phenomenon is advantageous in that it allows for power transmission over a longer distance than the electromagnetic induction method thanks to the principle of the electromagnetic resonance phenomenon, and that the transmission efficiency does not degrade much even with somewhat poor alignment.

It should be noted that the electric field resonance method is another method based on the electromagnetic resonance phenomenon.

This wireless power feeding system based on the electromagnetic resonance phenomenon requires no alignment and permits extension of the power feeding distance. However, dynamic impedance control is required to make the most of this feature.

Japanese Patent Laid-Open No. Hei 10-163889 (hereinafter referred to as Patent Document 1) discloses an automatic impedance matching method that reliably matches input and output impedances even in the event of a change in output impedance of a power amplifier.

FIG. 1 is a block diagram illustrating a transmitter (power feeding device) using the automatic impedance control method disclosed in Patent Document 1.

The power feeding device (transmitter) shown in FIG. 1 includes a power amplifier 1, load impedance detector 2, matching circuit 3, antenna 4, AD converter 5, CPU 6, motor or relay drive circuit 7 and determination threshold setter 8.

In the power feeding device, the load impedance detector 2 is provided between the power amplifier 1 and antenna (load) 4. The matching circuit 3 is controlled by the detection signal from this load impedance detector 2, thus matching input and output impedances.

The load impedance detector 2 has been calibrated with the input and output impedances obtained when the output impedance of the power amplifier 1 and the load impedance are matched so that the load impedance detection signal voltage is the median value of the detection voltage.

The CPU 6 adapted to control the matching circuit 3 controls impedance matching by driving the motor or relay drive circuit 7 with a detection output. The impedance determination threshold of a matching control program executed by the CPU 6 is changed with change in output impedance of the power amplifier 1.

The impedance determination threshold is changed by the determination threshold setter 8.

FIG. 2 is a diagram illustrating an example of an existing transmitter disclosed in Patent Document 1.

In this case, no determination threshold setter is provided because there is no need to dynamically change optimal control.

SUMMARY

The power feeding device configured as disclosed in the above Patent Document 1 requires an impedance detector and variable matching circuit between the target devices. Further, the power receiving device requires an impedance detector and variable matching circuit. Therefore, the above technique leads to disadvantages including a larger circuit scale, increased cost and power loss caused by inserted circuitry.

Accordingly, a power feeding apparatus, power receiving apparatus, wireless power feeding system, and method for wireless transfer of power are provided that can prevent increase in circuit scale and cost, ensure reduced power loss and adjust the impedance both on the power feeding and receiving sides.

According to an embodiment, there is provided a power feeding apparatus including an impedance detector, a controller, a power transmitter, a variable matching circuit, and a signal transmitter. The controller is configured to provide first control information and second control information based on an impedance detected by the impedance detector. The power transmitter is configured to wirelessly transmit power, the power transmitter including a power feeding coil with a variable diameter. The variable matching circuit is configured to change the variable diameter of the power feeding coil according to the first control information. The signal transmitter is configured to wirelessly transmit the second control information.

In the power feeding apparatus of an embodiment, the first control information is based on a current state of the variable matching circuit and the impedance detected by the impedance detector.

In the power feeding apparatus of an embodiment, the second control information is based on an external current state of an external variable matching circuit, associated with an external device, and an external impedance of the external device.

In the power feeding apparatus of an embodiment, the signal transmitter is configured to receive information from the external device including the external current state.

The power feeding apparatus of an embodiment further includes a storage device configured to store impedance characteristic information including a relationship between an impedance characteristic of the power feeding apparatus and an external impedance characteristic of the external device.

In the power feeding apparatus of an embodiment, the controller is configured to estimate the external impedance based on the impedance characteristic information and the impedance detected by the impedance detector.

In the power feeding apparatus of an embodiment, the second control information includes at least one of diameter change information, impedance detection result information, and setting information associated with an external variable matching circuit.

According to an embodiment, there is provided a power receiving apparatus including a power receiver, a signal receiver, and a variable matching circuit. The power receiver is configured to wirelessly receive power, the power receiver including a power feeding coil with a variable diameter. The signal receiver is configured to wirelessly receive control information, wherein the control information is based on an impedance detected in an external device. The variable matching circuit is configured to change the variable diameter of the power feeding coil according to the control information.

In the power receiving apparatus of an embodiment, the variable matching circuit changes the variable diameter of the power feeding coil independent of detecting an impedance in the power receiving apparatus.

In the power receiving apparatus of an embodiment, the signal receiver is configured to transmit information to the external device including a current state of the variable matching circuit.

In the power receiving apparatus of an embodiment, the control information includes at least one of diameter change information, impedance detection result information, and setting information associated with the variable matching circuit.

According to an embodiment, there is provided a wireless power feeding system including the power feeding apparatus and the power receiving apparatus.

According to an embodiment, there is provided a method for a wireless transfer of power from a power feeding apparatus to a power receiving apparatus. The method includes detecting an impedance in the power feeding apparatus, controlling transmission of power in the power feeding apparatus based on the impedance detected in the power feeding apparatus, and controlling reception of power in the power receiving apparatus based on the impedance detected in the power feeding apparatus.

In an embodiment of the method, controlling transmission of power in the power feeding apparatus is based on a current state of a variable matching circuit in the power feeding apparatus and the impedance detected in the power feeding apparatus.

In an embodiment of the method, controlling reception of power in the power receiving apparatus is based on a current state of a variable matching circuit in the power receiving apparatus and an impedance of the power receiving apparatus.

An embodiment of the method also includes wirelessly transmitting information from the power receiving apparatus to the power feeding apparatus, the information including the current state of the variable matching circuit in the power receiving apparatus.

An embodiment of the method also includes storing impedance characteristic information in the power feeding apparatus, the impedance characteristic information including a relationship between a first impedance characteristic of the power feeding apparatus and a second impedance characteristic of the power receiving apparatus.

An embodiment of the method also includes estimating the impedance of the power receiving apparatus based on the impedance characteristic information and the impedance detected in the power feeding apparatus.

An embodiment of the method also includes wirelessly transmitting control information from the power feeding apparatus to the power receiving apparatus, the control information including at least one of diameter change information, impedance detection result information, and setting information associated with a variable matching circuit in the power receiving apparatus.

In an embodiment of the method, controlling reception of power in the power receiving apparatus is independent of detecting an impedance in the power receiving apparatus.

Additional features and advantages are described herein, and will be apparent from the following Detailed Description and the figures.

BRIEF DESCRIPTION OF THE DRAWINGS

FIG. 1 is a block diagram illustrating the configuration of a transmitter (power feeding device) using the automatic impedance matching method disclosed in Patent Document 1.

FIG. 3 is a block diagram illustrating a configuration example of a wireless power feeding system according to an embodiment.

FIG. 4 is a diagram schematically illustrating the relationship between coils on the power transmitting and receiving sides according to the present embodiment.

FIG. 5 is a diagram schematically illustrating the configuration of a power feeding coil and variable matching circuit including diameter change capability.

FIG. 6 is a diagram illustrating an example of a common variable matching circuit.

FIG. 9 is a diagram illustrating a configuration example of an impedance detector according to the present embodiment.

FIG. 12 is a diagram illustrating, as a table, the relationship between the current state of the impedance on the power transmitting side and the state to which the variable matching circuit is to make a transition.

DETAILED DESCRIPTION

Figure 2:
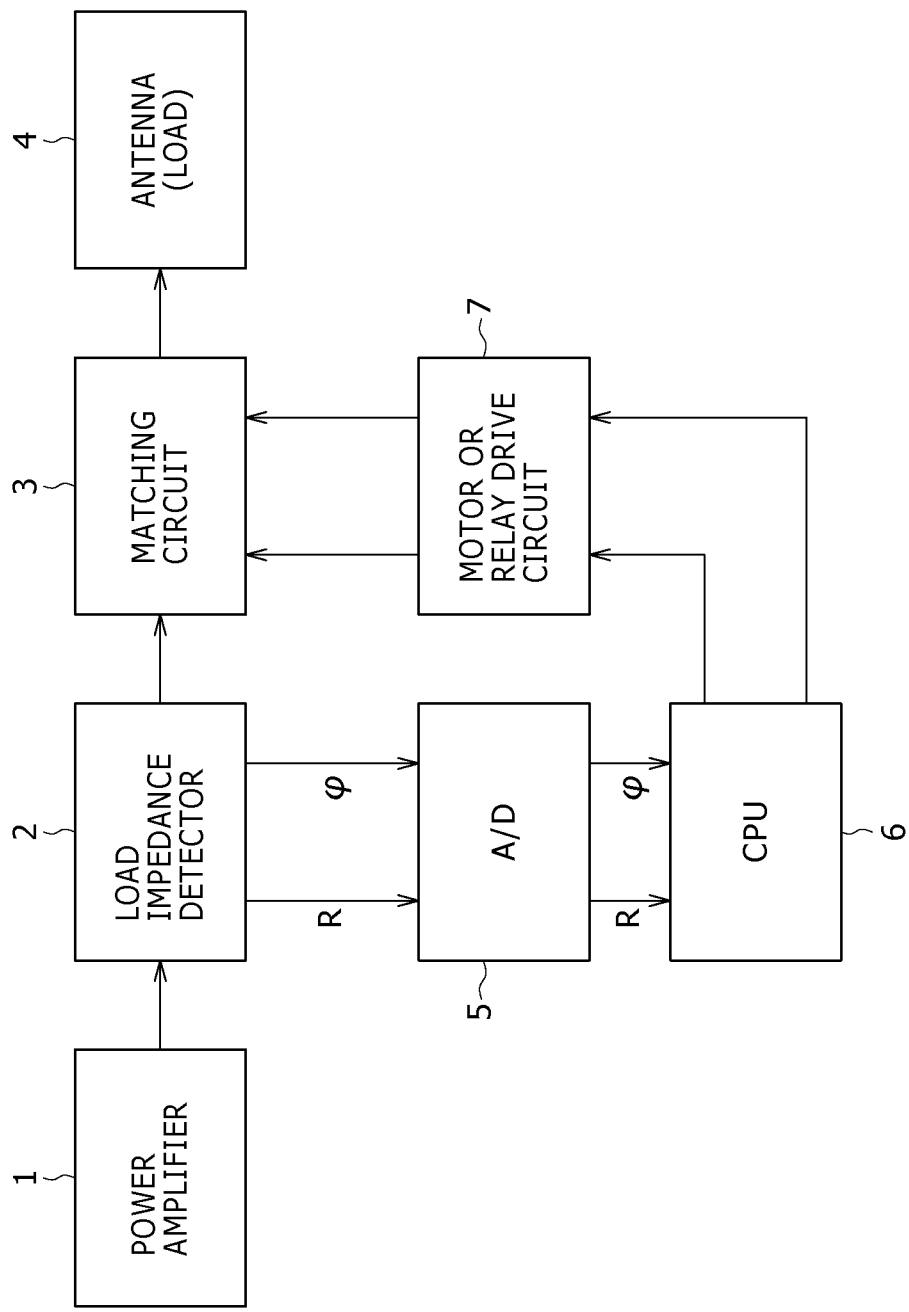
FIG. 2 is a diagram illustrating an example of an existing transmitter disclosed in Patent Document 1.

A description will be given below of embodiments with reference to the accompanying drawings.

It should be noted that the description will be given in the following order:

1. First embodiment of the wireless power feeding system
2. Diameter change capability of the power feeding coil and variable matching circuit
3. Control process adapted to control the diameter of the power feeding coil
4. Control process by the controller
5. Principle of the magnetic field resonance method
6. Impedance control operation
7. Second embodiment of the wireless power feeding system 1. First Embodiment of the Wireless Power Feeding System FIG. 3 is a block diagram illustrating a configuration example of a wireless power feeding system according to a first embodiment.

FIG. 4 is a diagram schematically illustrating the relationship between coils on the power transmitting and receiving sides of the wireless power feeding system according to the present embodiment.

A wireless power feeding system 10 includes a power feeding device 20 and power receiving device 30.

In the wireless power feeding system 10 according to the first embodiment, the power feeding device 20 includes an impedance detector and variable matching circuit, and the power receiving device 30 includes a variable matching circuit but not an impedance detector.

As described later, the impedance detector and variable matching circuit on the power feeding (power transmitting) side are each controlled by a controller serving as a control section to perform similar impedance conversion.

The power feeding device 20 includes a power transmitting element section 21, first variable matching circuit 22, impedance detector 23, high frequency power generation circuit 24 and controller 25 serving as a first control section.

Further, the power feeding device 20 includes a storage device (memory) 26 serving as a storage section and a wireless signal transmitter/receiver 27 serving as a first communication section.

The power transmitting element section 21 includes a power feeding coil 211 serving as a power feeding element and a resonance coil 212 serving as a resonance element.

The power feeding coil 211 is formed with an air-core coil.

The power feeding coil 211 is configured so that the diameter thereof can be changed by the variable matching circuit 22 in response to a switching control signal. The variable matching circuit 22 serves also as a diameter change section.

The resonance coil 212 is formed with an air-core coil that is coupled with the power feeding coil 211 by electromagnetic induction. A magnetic field resonance relationship is established when the self-resonance frequency of the resonance coil 212 matches that of a resonance coil 312 of the power receiving device 30, thus allowing for highly efficient power transmission.

2. Diameter Change Capability of the Power Feeding Coil and Variable Matching Circuit FIG. 5 is a diagram schematically illustrating the configuration of the power feeding coil and variable matching circuit including the diameter change capability.

The power feeding coil 211 shown in FIG. 5 includes a main line section ML1 that has its one end connected to a front end section F/E serving as a power feeding section.

The main line section ML1 of the power feeding coil 211 has its other end connected to one end of each of air-core coil sections SL1, SL2 and SL3. The air-core coil sections SL1, SL2 and SL3 have, respectively, diameters a1, a2 and a3 that are different from each other.

The air-core coil sections SL1, SL2 and SL3 are each formed so that the relationship a1<a2<a3 holds between the diameters a1, a2 and a3.

The power feeding coil 211 and variable matching circuit 22 have switch sections SW1 and SW2 adapted to change a diameter 'a.'

The switch sections SW1 and SW2 can be configured, for example, as part of the variable matching circuit 22 or power transmitting element section 21.

The switch sections SW1 and SW2 each have terminals 'x,' 'y' and 'z.'

The switch SW1 has its terminal 'x' connected to the front end section F/E, its terminal 'y' left unconnected, and its terminal 'z' connected to the other end of the air-core coil section SL1.

The switch SW2 has its terminal 'x' connected to the front end section F/E, its terminal 'y' connected to the other end of the air-core coil section SL2 and its terminal 'z' connected to the other end of the air-core coil section SL3.

The switches SW1 and SW2 are switched from one terminal to another independently of each other, respectively, in response to switching control signals CSW1 and CSW2 supplied, for example, from the controller 25.

That is, when the switching control signals CSW1 and CSW2 indicate, for example, the first state, the terminals 'x' and 'y' are connected in each of the switches SW1 and SW2.

In this case, the diameter of the power feeding coil 211 is equal to the diameter a2 which is the diameter of the air-core coil section SL2.

When the switching control signals CSW1 and CSW2 indicate the second state, the terminals 'x' and 'z' are connected in each of the switches SW1 and SW2.

In this case, the diameter of the power feeding coil 211 is substantially equal to the diameter a1 which is the diameter of the air-core coil section SL1.

At this time, although the air-core coil sections SL1 and SL3 remain connected to each other, the diameter of the power feeding coil 211 is equal to the smaller of the two diameters, or the diameter a1.

The variable matching circuit 22 has capability to achieve impedance matching at the power feeding point of the power feeding coil 211 in response to the control signals CSW1 and CSW2 supplied from the controller 25.

3. Control Process Adapted to Control the Diameter of the Power Feeding Coil

FIG. 4 illustrates a basic configuration of the magnetic field resonance wireless power feeding system 10.

In the same power feeding system 10, impedance matching at the power feeding point and load end is of extreme importance.

Impedance matching is generally conducted by adjusting a spacing D between the resonance coils and the ratio of the diameters of the two coils both on the power transmitting and receiving sides.

FIG. 6 is a diagram illustrating an example of a common variable matching circuit.

Series and parallel reactance elements are generally required to adjust the real part of the impedance. In order to switch between these reactance elements, four switches SW11, SW12, SW13 and SW14 are required.

Figure 7:
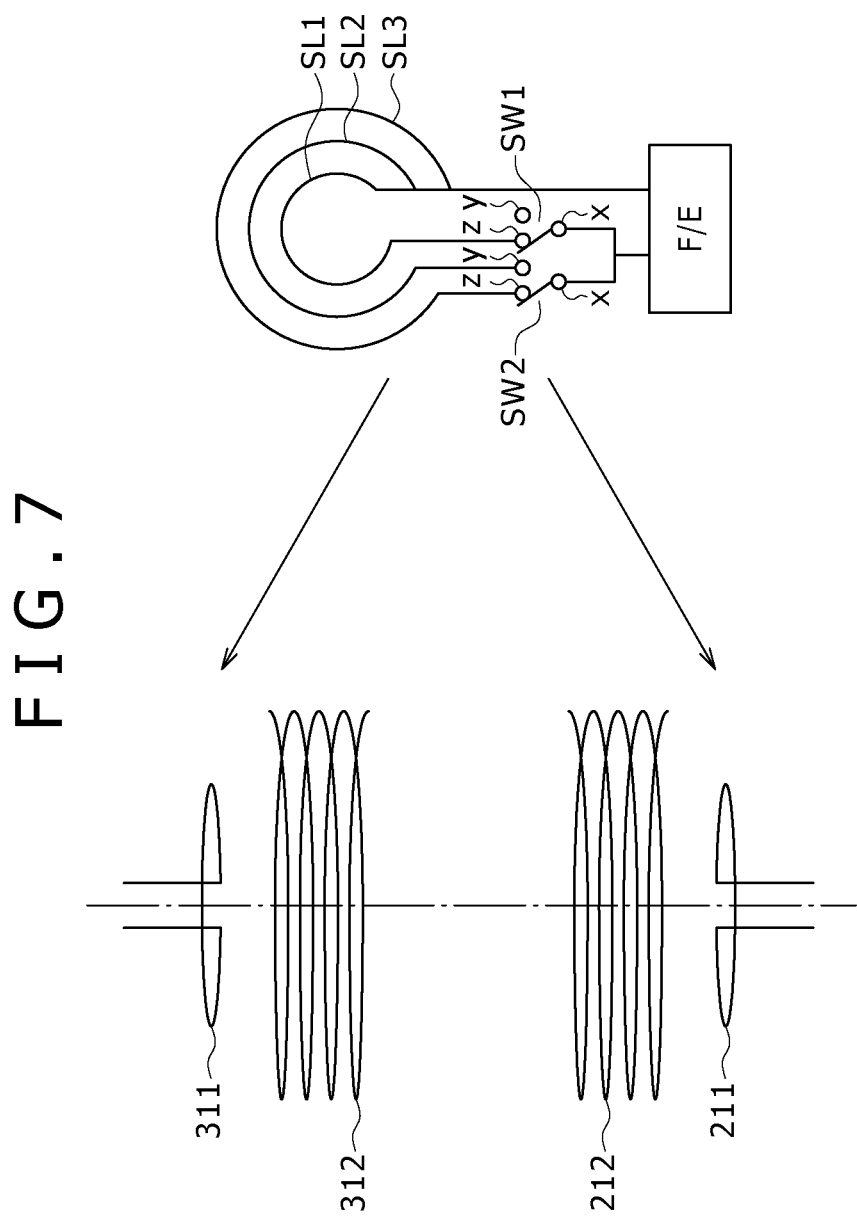
FIG. 7 is a diagram schematically illustrating a structure adapted to change the diameter of the power feeding coil in a power feeding device and power receiving device according to the present embodiment.

FIG. 7 is a diagram schematically illustrating a structure adapted to change the diameter of the power feeding coil in the power feeding device and power receiving device according to the present embodiment.

The present embodiment changes the diameters of the power feeding coil 211 and a power feeding coil 311 by using a magnetic field resonance impedance matching structure, thus providing a matching switching circuit with low loss.

Resonance coils with a high Q factor are generally used in a magnetic field resonance wireless power feeding system. As a result, connecting a circuit to the resonance coil leads to a large loss.

In contrast, the impedance of the power feeding coils is converted to low impedance. Therefore, connecting a circuit to the power feeding coil leads to only a small loss.

Further, eight switches SW11 to SW18 are required to provide three possible values for the real part of the impedance in the common variable matching circuit shown in FIG. 6. In contrast, the method according to the present embodiment shown in FIGS. 5 and 7 can provide three possible values with only two switches or the switches SW1 and SW2, thus providing a variable matching circuit at low cost.

Figure 8:
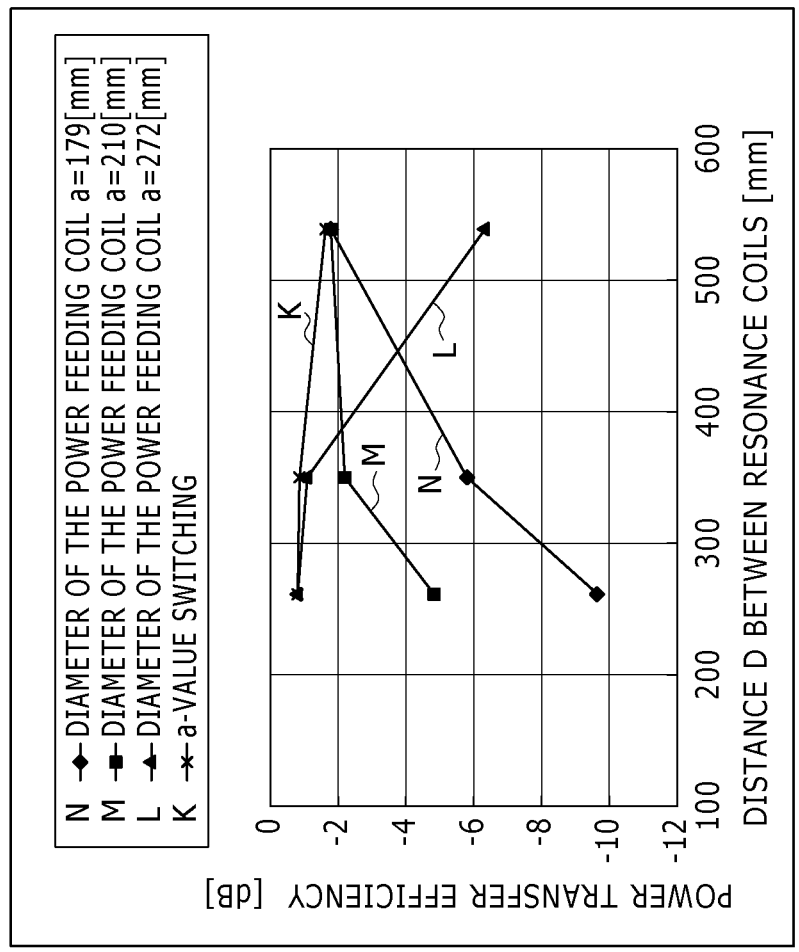
FIG. 8 is a diagram illustrating the power transfer characteristic as a result of the change in spacing between resonance coils (distance between the power transmitting and receiving sides) in the present embodiment and a comparative example.

FIG. 8 is a diagram illustrating the power characteristic as a result of the change in distance between the resonance coils (distance between the power transmitting and receiving sides) in the present embodiment and a comparative example.

In FIG. 8, the horizontal axis represents the spacing D between the resonance coils, and the vertical axis represents the power reception level.

In FIG. 8, the curve indicated by letter K represents the characteristic when the diameter 'a' of the power feeding coil according to the present embodiment can be changed.

The curve indicated by letter L represents the characteristic shown as a comparative example. This curve represents the characteristic if the diameter 'a' of the power feeding coil is fixed to 272 mm.

The curve indicated by letter M represents the characteristic shown as a comparative example. This curve represents the characteristic if the diameter 'a' of the power feeding coil is fixed to 210 mm.

The curve indicated by letter N represents the characteristic shown as a comparative example. This curve represents the characteristic if the diameter 'a' of the power feeding coil is fixed to 179 mm.

It is normally necessary to readjust the impedance in a magnetic field resonance wireless power feeding system when the spacing between the resonance coils on the power transmitting and receiving sides (distance between the power transmitting and receiving sides) is changed.

For example, if the diameter 'a' of the power feeding coil is fixed to 272 mm in FIG. 8, the power transfer efficiency characteristic degrades significantly for the distance D between the resonance coils of 550 mm as shown by the curve L.

If the diameter 'a' of the power feeding coil is fixed to 179 mm, the power transfer efficiency characteristic is excellent for the distance D between the resonance coils of 550 mm but degrades significantly for the distance D of around 250 mm as shown by the curve N.

On the other hand, if the diameter 'a' of the power feeding coil is variable as in the present embodiment, the power transfer efficiency characteristic is excellent with minimal degradation even against the change in the distance D between the resonance coils from 250 mm to 550 mm as shown by the curve K.

Although a case was described in the present embodiment shown in FIGS. 5 and 7 in which the diameter is switched between two options, it is possible to form more air-core coil sections and switch the diameter using the switch section SW1.

The controller 25 and a controller 36 exercise control so that the shorter the distance D between the resonance coils (the closer the resonance coils are to each other), the larger the diameters 'a' of the power feeding coils 211 and 311, and that the longer the distance D (the farther the resonance coils are from each other), the smaller the diameters 'a' thereof.

The impedance detector 23 has capability to detect the impedance on the power feeding (power transmitting) side of the power feeding device 20, for example, based on the high frequency power generated by the high frequency power generation circuit 24 and supplies the detection result to the controller 25 as a signal S23.

FIG. 9 is a diagram illustrating a configuration example of the impedance detector according to the present embodiment.

The impedance detector 23 includes a voltage detector 231 and current detector 232.

The voltage detector 231 divides the supplied voltage with resistance elements R1 and R2 to detect a voltage VL.

The current detector 232 includes a transformer T1 and resistors R3 and R4 and detects a current IL from the supplied voltage.

Then, an impedance Z (Ω) is found by dividing the detected voltage VL by the detected current IL.

Further, the impedance detector 23 supplies high frequency power, generated by the high frequency power generation circuit 24, to the variable matching circuit 22.

The high frequency power generation circuit 24 generates high frequency power for wireless power transmission.

A switching amplifier, for example, is used as the same circuit 24 because high frequency power should desirably be generated with high efficiency.

High frequency power generated by the high frequency power generation circuit 24 is supplied to the variable matching circuit 22 via the impedance detector 23 and fed (applied) to the power feeding coil 211 of the power transmitting element section 21.

In response to the detection result from the impedance detector 23, the controller 25 outputs a first control signal S25 to the variable matching circuit 22 so that impedance matching performed by the variable matching circuit 22 ensures high efficiency in power transmission.

In other words, the controller 25 exercises control so that the self-resonance frequency of the resonance coil 212 matches that of the resonance coil 312 of the power receiving device 30 to establish a magnetic field resonance relationship, thus ensuring high efficiency in power transmission.

It should be noted that the control signal S25 includes the switching control signals CSW1 and CSW2 supplied to the variable matching circuit 22.

4. Control Process by the Controller

The controller 25 exercises control with high accuracy according to the impedance detection result when the power feeding (power transmitting) side and power receiving side are strongly coupled in the magnetic field resonance wireless power feeding system 10.

Here, the term "strong coupling" refers to the fact that the power transmitting and receiving element sections are located at a distance from each other that allows for power transmission and refers, for example, to a case in which the power feeding efficiency is about 80% or greater.

In the present embodiment, impedance characteristic estimation information is stored in the storage device 26 as a reference table (relationship table). Impedance characteristic estimation information is used to estimate the impedance characteristic of the power receiving side from the impedance characteristic of the power transmitting side.

The controller 25 receives information of the voltage VL and current IL detected by the impedance detector 23 and finds the current impedance Z (=VL/IL) of the power feeding (power transmitting) side.

When the detected impedance Z is, for example, 50Ω, the controller 25 determines that the VSWR (Voltage Standing Wave Ratio) is 1, which is ideal.

If the detected impedance Z is 25Ω or 100Ω, the controller 25 determines that the VSWR is 2.

In the present embodiment, the controller 25 determines, for example from the detected impedance Z, in which of the first to forth quadrants of the Smith chart the current impedance characteristic is as described later.

Then, the controller 25 controls the variable matching circuit 22 so that the VSWR approaches 1, in other words, so that the VSWR approaches the boundary of the quadrants which is the center of the Smith chart.

The controller 25 according to the present embodiment controls impedance matching so that the VSWR is substantially, for example, about 1.2 to 1.5.

The controller 25 finds the impedance states of the power transmitting and receiving sides and the optimal set state of the variable matching circuit 22 from the impedance Z, set state information of the variable matching circuit 22, impedance information of the storage device 26 and reference table information.

The controller 25 changes the state of the variable matching circuit 22 so that the same circuit 22 assumes the set state.

Here, the variable matching circuit 22 does not permit continuous change of the impedance. Instead, the same circuit 22 can be switched from one state to another among several possible states as described with reference to FIGS. 5 to 8.

As a result of the above control, the controller 25 provides the optimal impedance states of the power transmitting and receiving sides, thus allowing for excellent wireless power feeding operation.

Figure 10B:
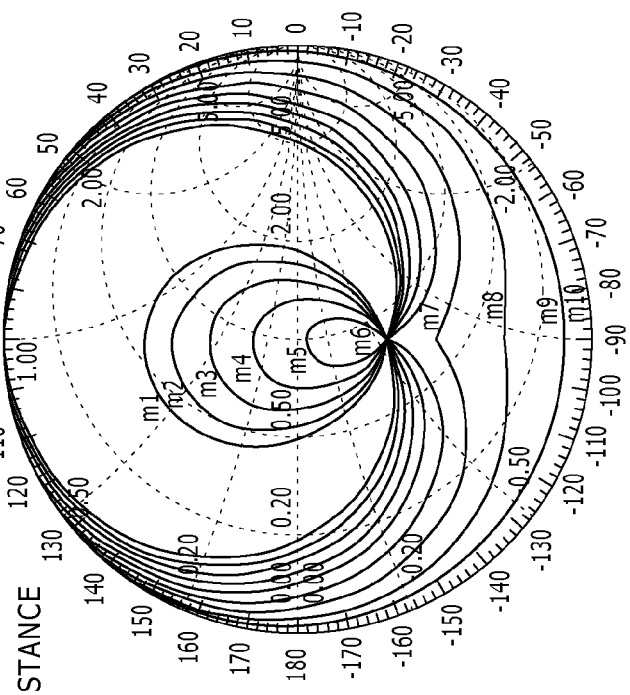
FIGS. 10A and 10B are diagrams illustrating examples of impedance characteristics of the coils on the power transmitting and receiving sides when the distance is changed between the power transmitting and receiving coils.
Figure 10A:
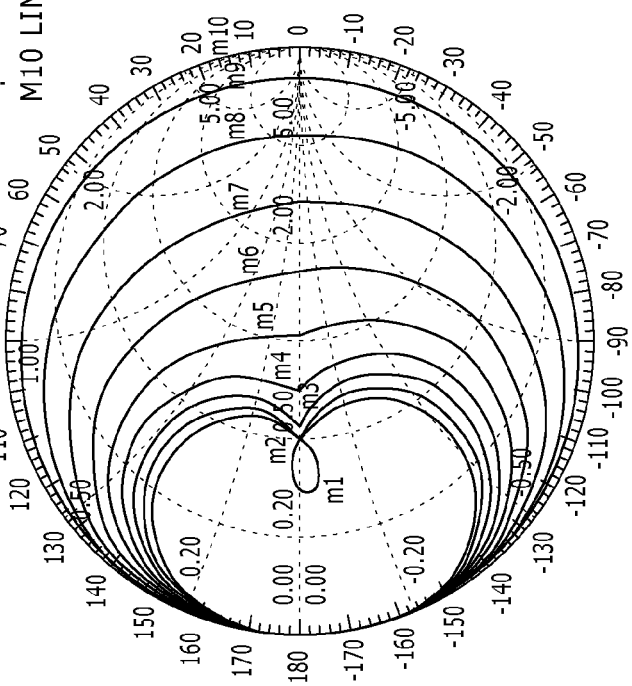

FIGS. 10A and 10B are diagrams illustrating examples of impedance characteristics of the coils on the power transmitting and receiving sides when the distance is changed between the power transmitting and receiving elements.

FIG. 10A illustrates the impedance characteristic of the power transmitting (power feeding) side as Smith chart 1.

FIG. 10B illustrates the impedance characteristic of the power receiving side as Smith chart 2.

Although the directions in which the impedance characteristic curves of the power transmitting and receiving sides are formed differ, this is not the essence of the matter. The two characteristic curves have a correlation that provides substantial impedance matching.

The smaller the value 'm' shown in FIGS. 10A and 10B, the shorter the distance between the power transmitting and receiving elements. On the other hand, the larger the value 'm,' the longer the distance therebetween.

Figure 11:
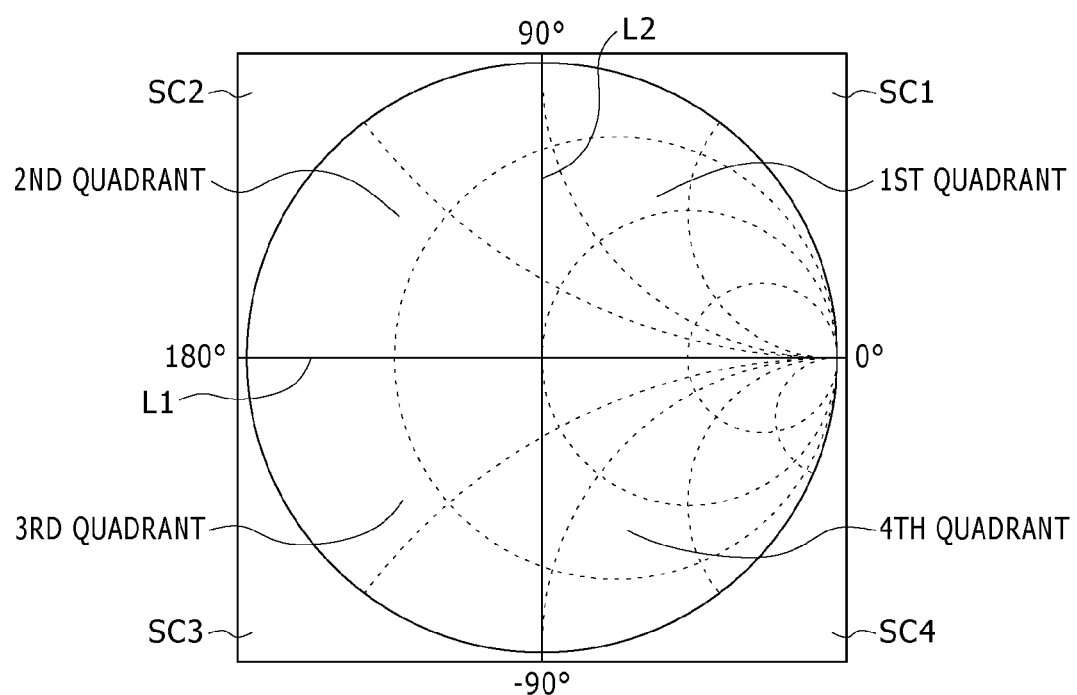
FIG. 11 is a diagram illustrating a Smith chart whose characteristic range is divided into the first to fourth quadrants.

FIG. 11 is a diagram illustrating a Smith chart whose characteristic range is divided into first to fourth quadrants SC1 to SC4.

The Smith chart is divided into the first to fourth quadrants SC1 to SC4 by two lines, a line L1 connecting the 0 degrees and 180 degrees and a line L2 connecting the 90 degrees and −90 degrees.

The first quadrant SC1 includes the top right characteristic range from 0 to 90 degrees in FIG. 11.

The second quadrant SC2 includes the top left characteristic range from 90 to 180 degrees in FIG. 11.

The third quadrant SC3 includes the bottom left characteristic range from 180 to −90 degrees in FIG. 11.

The fourth quadrant SC4 includes the bottom right characteristic range from −90 to 0 degrees in FIG. 11.

FIG. 12 is a diagram illustrating, as a table, the relationship between the current state of the impedance on the power transmitting side and the state to which the variable matching circuit is to make a transition.

Figure 13A:
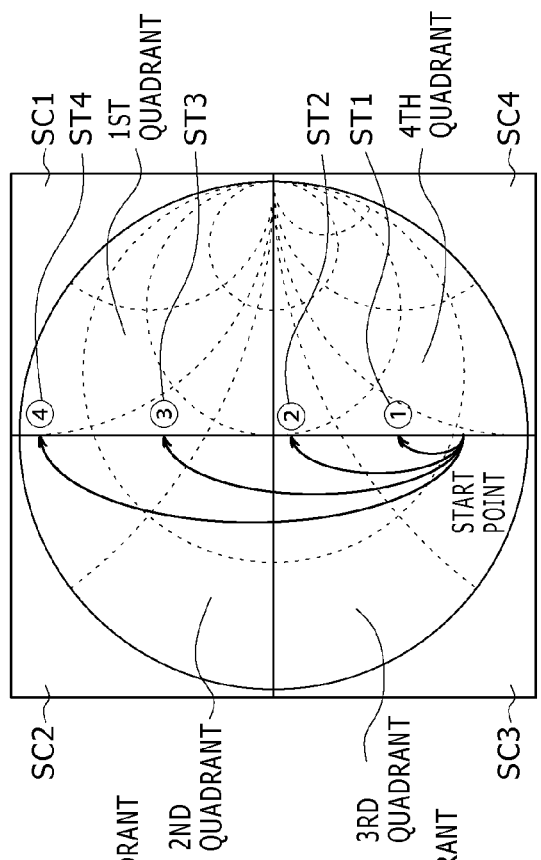
FIGS. 13A and 13B are diagrams illustrating examples of changes in impedance on the power transmitting and receiving sides depending on the state of the matching circuits.
Figure 13B:
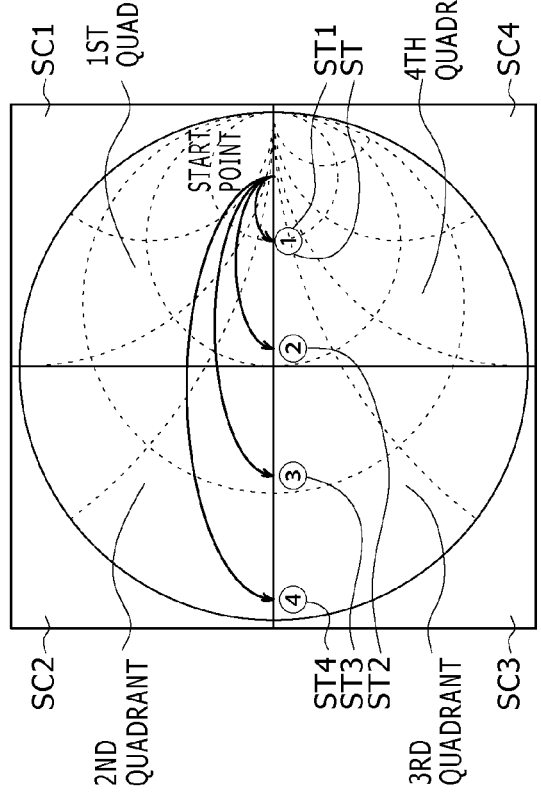

FIGS. 13A and 13B are diagrams illustrating examples of changes in impedance on the power transmitting and receiving sides depending on the states of the matching circuits.

ST1 represents the first state of impedance conversion, ST2 represents the second state thereof, ST3 represents the third state thereof, and ST4 represents the fourth state thereof.

On the power transmitting (feeding) side, the start point impedance is converted to a slightly smaller level in the first state (ST1). In the fourth state (ST4), the start point impedance is converted to a significantly smaller level. That is, the order of impedance conversion ratio is ST4>ST3>ST2>ST1.

As a result, on the power receiving side, the imaginary part of the start point impedance is converted to a slightly less negative level in the first state (ST1) so that the start point impedance makes a direct upward transition in the Smith chart. In the fourth state (ST4), the imaginary part of the start point impedance is converted to a positive level so that the start point impedance makes a significant direct upward transition in the Smith chart. That is, the order of impedance conversion ratio is ST4>ST3>ST2>ST1.

The controller 25 according to the present embodiment changes the state of the matching circuit, for example, if the VSWR found from the impedance on the power transmitting side is 3 or greater.

In this case, the controller 25 finds the next state to which the matching circuit 22 is to make a transition according to the current state thereof by referring to Table in FIG. 12 and supplies the control signal S25 to the variable matching circuit 22 so that the same circuit 22 makes a state transition.

At this time, if, for example, the power transmitting and receiving elements have the impedance characteristics shown respectively in FIGS. 10A and 10B, a table is prepared in advance so that the matching circuit of the power transmitting coil performs impedance conversion appropriate to the state of the matching circuit as shown in FIG. 13A.

Similarly, a table is prepared so that the matching circuit on the power receiving side performs impedance conversion appropriate to the state of the matching circuit as shown in FIG. 13B.

As described above, combinations of impedance change and state of the matching circuit associated therewith must be made available in advance.

In FIG. 12, if the current state of impedance on the power transmitting side is in the first or fourth quadrant SC1 or SC4, and when the variable matching circuit 22 is currently in the first state ST1, the controller 25 generates the control signal S25 so that the variable matching circuit 22 makes a transition to the second state ST2.

In this case, the variable matching circuit 22 changes the diameter of the power feeding coil 211 to a smaller size.

When the variable matching circuit 22 is currently in the second state ST2, the controller 25 generates the control signal S25 so that the variable matching circuit 22 makes a transition to the third state ST3.

In this case, the variable matching circuit 22 changes the diameter of the power feeding coil 211 to a smaller size.

When the variable matching circuit 22 is currently in the third state ST3, the controller 25 generates the control signal S25 so that the variable matching circuit 22 makes a transition to the fourth state ST4.

In this case, the variable matching circuit 22 changes the diameter of the power feeding coil 211 to a smaller size.

When the variable matching circuit 22 is currently in the fourth state ST4, the controller 25 generates the control signal S25 so that the variable matching circuit 22 makes a transition to the third state ST3.

In this case, the variable matching circuit 22 changes the diameter of the power feeding coil 211 to a larger size.

As described above, the present embodiment provides an automatic impedance matching device for wirelessly power feeding that allows for impedance adjustment both on the power transmitting (feeding) and receiving sides.

Although a description was given here of a case in which the impedance is automatically adjusted with change in the distance between the power transmitting and receiving elements, the present embodiment is also applicable to other purposes.

For example, if the present embodiment is used to eliminate impedance mismatch caused by the change in load impedance connected to the power receiving device when the distance remains fixed, the automatic impedance matching device can be configured in the following manner.

That is, a correspondence table is prepared in advance between the load impedance and the impedances of the coils on the power transmitting and receiving sides. This makes it possible to adjust the impedances on the power transmitting and receiving sides by detecting the change in impedance on the power transmitting side.

The wireless signal transmitter/receiver 27 includes wireless communication capability and can exchange information such as impedance control information including diameter change information, setting information and impedance detection result information with the controller 36 on the power receiving device 30 side through wireless communication.

Among wireless communication schemes that can be used are Bluetooth and RFID.

The power receiving device 30 includes a power receiving element section 31, second variable matching circuit 32, rectifying circuit 33, voltage stabilizing circuit 34, load 35, controller 36 serving as a second control section and wireless signal transmitter/receiver 37 serving as a second communication section.

The power receiving element section 31 includes the power feeding coil 311 serving as a power feeding element and the resonance coil 312 serving as a resonance element.

The power feeding coil 311 is fed with AC current from the resonance coil 312 by electromagnetic induction. The power feeding coil 311 is configured so that the diameter thereof can be changed by the variable matching circuit 32 serving as a diameter change section.

The diameter change section of the power feeding coil 311 that includes the same coil 311 and variable matching circuit 32 can be configured in the same manner as that in the power feeding device 20 described earlier. Therefore, a detailed description thereof is omitted.

In this case, the front end section F/E serves as a power receiving section.

The resonance coil 312 is formed with an air-core coil that is coupled with the power feeding coil 311 by electromagnetic induction. A magnetic field resonance relationship is established when the self-resonance frequency of the resonance coil 312 matches that of the resonance coil 212 of the power feeding device 20, thus allowing for highly efficient power reception.

The variable matching circuit 32 has capability to achieve impedance matching at the load end of the power feeding coil 311 in response to a control signal S36 including control signals CSW31 and CSW32 supplied from the controller 36.

The variable matching circuit 32 controls impedance matching in such a manner as to respond to control exercised in the power feeding device 20 according to the control information of the controller 25 of the power feeding device 20 received via the wireless signal transmitter/receiver 37.

The rectifying circuit 33 rectifies the received AC power into DC power and supplies the DC power to the voltage stabilizing circuit 34.

The voltage stabilizing circuit 34 converts the DC power supplied from the rectifying circuit 33 into a DC voltage compatible with the specification of the destination electronic device, supplying the stabilized DC voltage to the load 35, i.e., electronic device.

The controller 36 can exchange impedance control information and other information with the wireless signal transmitter/receiver 27 and controller 25 of the power feeding device 20 via the wireless signal transmitter/receiver 37.

The controller 36 controls the variable matching circuit 32 in such a manner as to respond to control exercised in the power feeding device 20 according to the control information of the controller 25 of the power feeding device 20 received via the wireless signal transmitter/receiver 37.

The controller 36 outputs the control signal S36 to the variable matching circuit 32 so that impedance matching performed by the variable matching circuit 32 ensures high efficiency in power transmission.

A description will be given next of the operation of the wireless power feeding system 10 configured as described above with primary emphasis on the principle of the magnetic field resonance method and the process adapted to control the diameters of the power feeding coils 211 and 311.

5. Principle of the Magnetic Field Resonance Method

A description will be given first of the principle of the magnetic field resonance method with reference to FIGS. 14 to 17.

Figure 14:
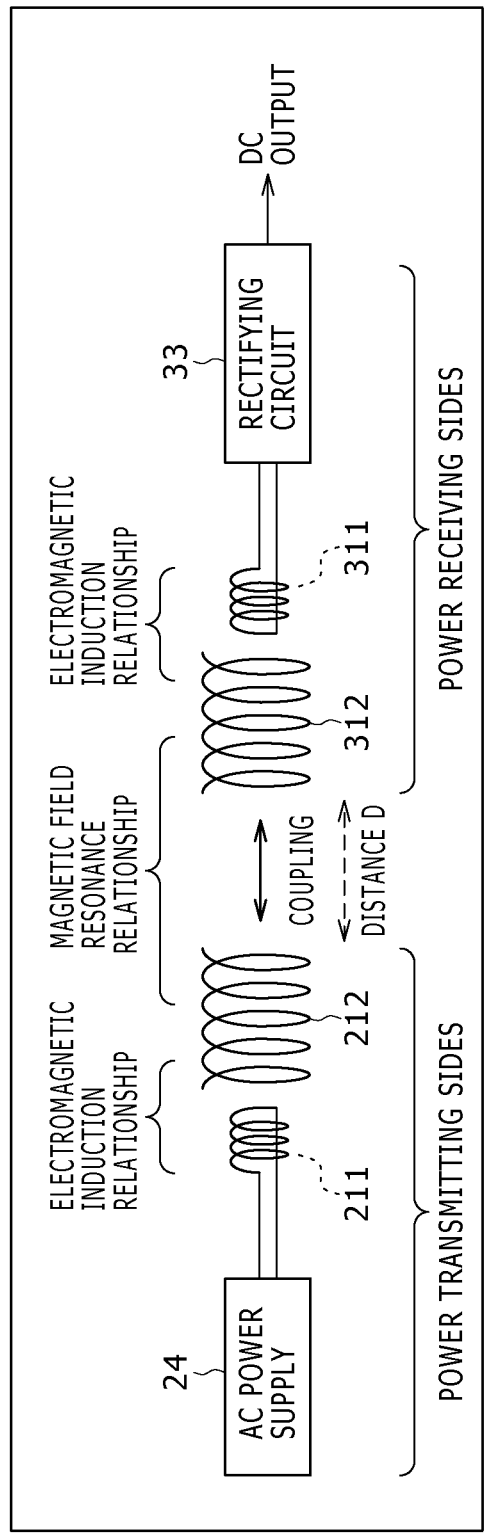
FIG. 14 is a diagram describing the principle of the magnetic field resonance method.

FIG. 14 is a diagram describing the principle of the magnetic field resonance method.

It should be noted that the principle will be described here assuming that the power feeding coils are power feeding elements and that the resonance coils are resonance elements.

The electromagnetic resonance phenomenon can be classified into two types, namely, the electric field resonance method and magnetic field resonance method. Of the two methods, FIG. 14 illustrates a basic block of a wireless (non-contact) power feeding system of magnetic field resonance type with one-to-one relationship between the power feeding side and power receiving side.

When considered in association with the configuration shown in FIG. 3, the power feeding side has the AC power source 24, power feeding element 211 and resonance element 212, and the power receiving side has the resonance element 312, power feeding element 311 and rectifying circuit 33.

FIG. 14 is a diagram designed to describe the basic principle. Therefore, the variable matching circuit 22, impedance detector 23, controller 25, storage device 26 and wireless signal transmitter/receiver 27 are omitted in the power feeding device 20.

The variable matching circuit 32, voltage stabilizing circuit 34, load 35, controller 36 and wireless signal transmitter/receiver 37 are omitted in the power receiving device 30.

The power feeding elements 211 and 311 and resonance elements 212 and 312 are formed with air-core coils.

On the power feeding side, the power feeding element 211 and resonance element 212 are strongly coupled by electromagnetic induction. Similarly, the power feeding element 311 and resonance element 312 are strongly coupled by electromagnetic induction on the power receiving side.

A magnetic field resonance relationship is established when the self-resonance frequencies of the air-core coils, i.e., the resonance elements 212 and 312 respectively on the power feeding and receiving sides, match, providing the maximum coupling level and minimum loss.

An AC current is supplied from the AC power source 24 to the power feeding element 211, further causing a current to be induced in the resonance element 212 by electromagnetic induction.

The frequency of the AC current generated by the AC power source 24 is set identical to the self-resonance frequency of the resonance elements 212 and 312.

The resonance elements 212 and 312 are disposed in such a manner that a magnetic field resonance relationship is established therebetween. This allows for the AC current to be supplied wirelessly (in a noncontact manner) from the resonance element 212 to the resonance element 312 at the resonance frequency.

On the power receiving side, the current is supplied from the resonance element 312 to the power feeding element 311 by electromagnetic induction, followed by generation and output of a DC current by the rectifying circuit 33.

Figure 15:
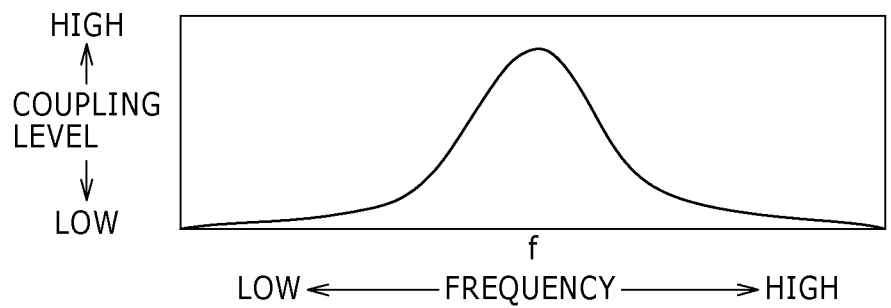
FIG. 15 is a diagram illustrating the frequency characteristic of coupling level in the magnetic field resonance method.

FIG. 15 is a diagram illustrating the frequency characteristic of coupling level in the magnetic field resonance method.

In FIG. 15, the horizontal axis represents a frequency f of the AC power source, and the vertical axis represents the coupling level.

FIG. 15 illustrates the relationship between the frequency of the AC power source and the coupling level.

It is clear from FIG. 15 that magnetic resonance demonstrates frequency selectivity.

Figure 16:
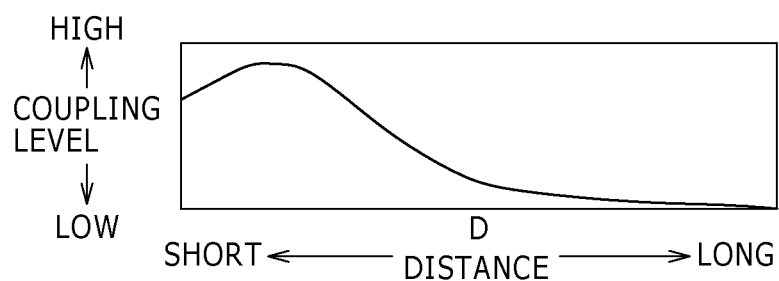
FIG. 16 is a diagram illustrating the relationship between the distance between the resonance coils and the coupling level in the magnetic field resonance method.

FIG. 16 is a diagram illustrating the relationship between the distance between the resonance elements and the coupling level in the magnetic field resonance method.

In FIG. 16, the horizontal axis represents the distance D between the resonance elements, and the vertical axis represents the coupling level.

FIG. 16 illustrates the relationship between the distance D between the resonance element 212 on the power feeding side and the resonance element 312 on the power receiving side and the coupling level.

It is clear from FIG. 16 that the distance D exists where the coupling level is maximum at a given resonance frequency.

Figure 17:
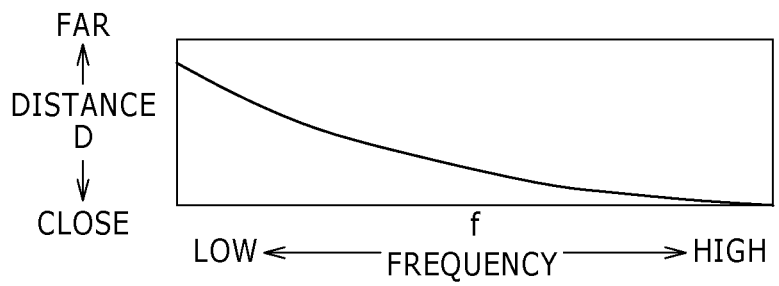
FIG. 17 is a diagram illustrating the relationship between the resonance frequency and the distance between the resonance coils that provides the maximum coupling level in the magnetic field resonance method.

FIG. 17 is a diagram illustrating the relationship between the resonance frequency and the distance between the resonance elements that provides the maximum coupling level in the magnetic field resonance method.

In FIG. 17, the horizontal axis represents the resonance frequency f, and the vertical axis represents the distance D between the resonance elements.

FIG. 17 illustrates the relationship between the resonance frequency and the distance D between the resonance element 212 on the power feeding side and the resonance element 312 on the power receiving side that provides the maximum coupling level.

It is clear from FIG. 17 that the maximum coupling level can be achieved by widening the gap between the resonance elements when the resonance frequency is low and by narrowing the gap therebetween when the resonance frequency is high.

6. Impedance Control Operation

In the power feeding device 20, the voltage VL and current IL are detected by the impedance detector 23, and the detection result is supplied to the controller 25 as the signal S23.

In response to the information of the voltage VL and current IL detected by the impedance detector 23, the controller 25 finds the current impedance Z (=VL/IL) on the power feeding (transmitting) side.

The controller 25 finds the impedance states of the power transmitting and receiving sides and the optimal set state of the variable matching circuit 22 from the impedance Z, set state information of the variable matching circuit 22 and impedance information and reference table information of the storage device 26.

The controller 25 changes the state of the variable matching circuit 22 so that the same circuit 22 assumes the found set state.

The controller 25 changes the state of the matching circuit 22, for example, if the VSWR found from the impedance on the power transmitting side is 3 or greater.

In this case, the controller 25 refers to the table shown in FIG. 12 to find the next state to which the matching circuit 22 is to make a transition according to the current state thereof and supplies the control signal S25 to the variable matching circuit 22 so that the same circuit 22 makes a state transition.

In FIG. 12, if the current state of impedance on the power transmitting side is in the first or fourth quadrant SC1 or SC4, and when the variable matching circuit 22 is currently in the first state ST1, the controller 25 generates the control signal S25 so that the variable matching circuit 22 makes a transition to the second state ST2.

In this case, the variable matching circuit 22 changes the diameter of the power feeding coil 211 to a smaller size.

When the variable matching circuit 22 is currently in the second state ST2, the controller 25 generates the control signal S25 so that the variable matching circuit 22 makes a transition to the third state ST3.

In this case, the variable matching circuit 22 changes the diameter of the power feeding coil 211 to a smaller size.

When the variable matching circuit 22 is currently in the third state ST3, the controller 25 generates the control signal S25 so that the variable matching circuit 22 makes a transition to the fourth state ST4.

In this case, the variable matching circuit 22 changes the diameter of the power feeding coil 211 to a smaller size.

When the variable matching circuit 22 is currently in the fourth state ST4, the controller 25 generates the control signal S25 so that the variable matching circuit 22 remains in the fourth state ST4.

In this case, the variable matching circuit 22 does not change the diameter of the power feeding coil 211.

In FIG. 12, if the current state of impedance on the power transmitting side is in the second or third quadrant SC2 or SC3, and when the variable matching circuit 22 is currently in the first state ST1, the controller 25 generates the control signal S25 so that the variable matching circuit 22 remains in the first state ST1.

In this case, the variable matching circuit 22 does not change the diameter of the power feeding coil 211.

When the variable matching circuit 22 is currently in the second state ST2, the controller 25 generates the control signal S25 so that the variable matching circuit 22 makes a transition to the first state ST1.

In this case, the variable matching circuit 22 changes the diameter of the power feeding coil 211 to a larger size.

When the variable matching circuit 22 is currently in the third state ST3, the controller 25 generates the control signal S25 so that the variable matching circuit 22 makes a transition to the second state ST2.

In this case, the variable matching circuit 22 changes the diameter of the power feeding coil 211 to a larger size.

When the variable matching circuit 22 is currently in the fourth state ST4, the controller 25 generates the control signal S25 so that the variable matching circuit 22 makes a transition to the third state ST3.

In this case, the variable matching circuit 22 changes the diameter of the power feeding coil 211 to a larger size.

Then, control information is transmitted wirelessly from the wireless signal transmitter/receiver 27 to the controller 36 of the power receiving device 30 so that the variable matching circuit 32 of the power receiving device 30 is controlled in such a manner as to respond to control exercised over the variable matching circuit 22 of the power feeding device 20.

In the power receiving device 30, the controller 36 controls the variable matching circuit 32 in such a manner as to respond to control exercised in the power feeding device 20 according to the control information of the controller 25 of the power feeding device 20 received via the wireless signal transmitter/receiver 37.

7. Second Embodiment of the Wireless Power Feeding System

Figure 18:
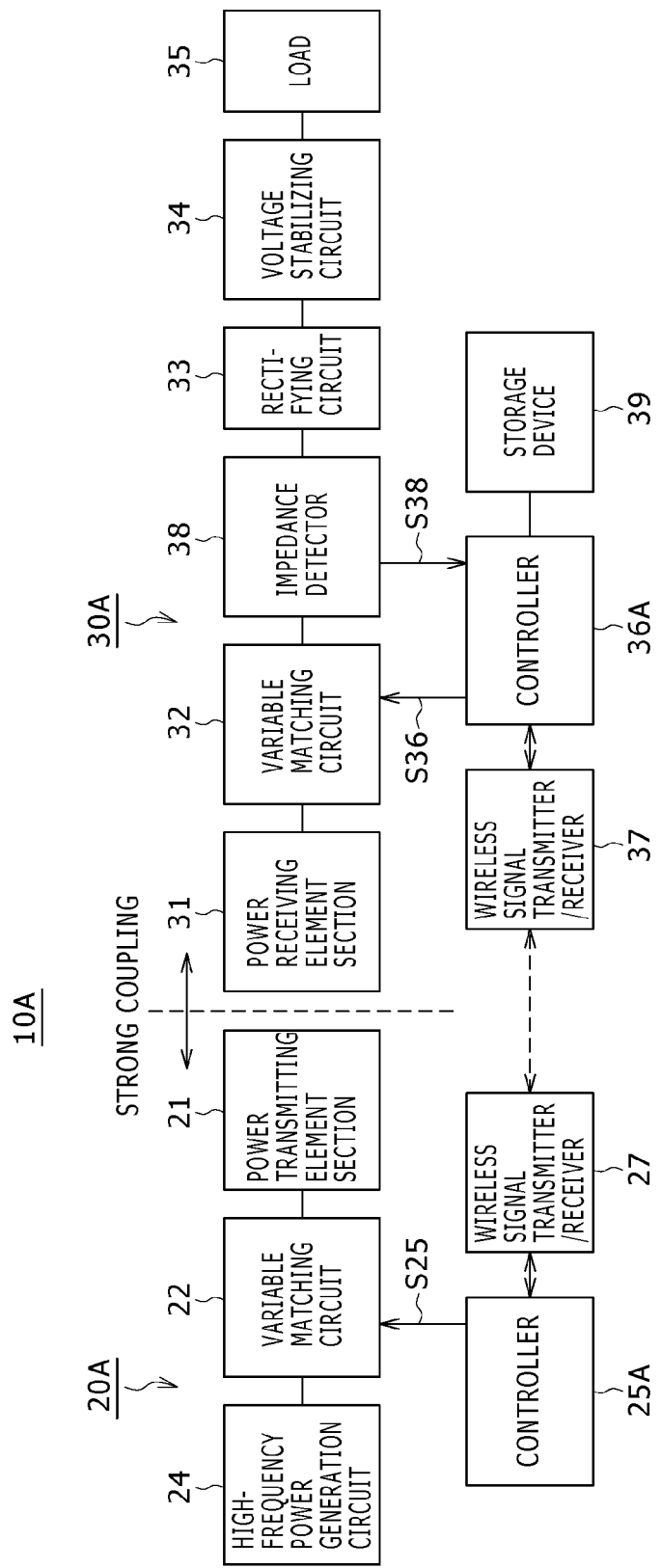
FIG. 18 is a block diagram illustrating a configuration example of the wireless power feeding system according to a second embodiment.

FIG. 18 is a block diagram illustrating a configuration example of the wireless power feeding system according to a second embodiment.

A wireless power feeding system 10A according to the second embodiment differs from the wireless power feeding system 10 according to the first embodiment in that an impedance detector and storage device are provided in a power receiving device 30A rather than in a power feeding device 20A.

In this case, the matching circuit 32 is controlled according to the detection result from an impedance detector 38 of the power receiving device 30A in the same manner as in the first embodiment.

Control information is transmitted wirelessly from a wireless signal transmitter/receiver 37 serving as a second communication section to a controller 25A of the power feeding device 20A so that the matching circuit 22 of the power feeding device 20A is controlled in such a manner as to respond to control exercised over the matching circuit 32 of the power receiving device 30A.

In this case, the variable matching circuit 32 includes capability to achieve impedance matching in response to a control signal at a connection portion between the power feeding element adapted to feed the power and the load.

The controller 36 serving as a second control section has capability to find the impedance states of the power transmitting and receiving sides and the optimal set state of the variable matching section from the detected impedance, set state information of the variable matching section and reference table information of the storage device 39.

Control information is transmitted wirelessly from the wireless signal transmitter/receiver 37 to the controller 25A of the power feeding device 20A.

The controller 25A of the power feeding device 20A controls the matching circuit 22 in such a manner as to respond to control exercised in the power receiving device 30A according to the control information of the controller 36 of the power receiving device 30A received via the wireless signal transmitter/receiver 27 serving as a first communication section.

The second embodiment is identical to the first embodiment in all other respects.

As described above, the present embodiment provides the following advantageous effects.

That is, the present embodiment prevents increase in circuit scale and cost, ensures reduced power loss and moreover adjusts the impedance both on the power feeding and receiving sides.

Further, the present embodiment provides low cost and low loss variable matching capability.

This ensures optimal impedance matching in the event of a change in the distance between the resonance coils on the power transmitting and receiving sides (distance between the power transmitting and receiving sides), thus allowing to maintain an excellent characteristic.

It should be understood that various changes and modifications to the embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A power feeding apparatus comprising:
   an impedance detector;
   a controller configured to provide first control information and second control information based on an impedance detected by the impedance detector;
   a power transmitter configured to wirelessly transmit power, the power transmitter including a power feeding coil with a variable diameter;
   a variable matching circuit configured to change the variable diameter of the power feeding coil according to the first control information; and
   a signal transmitter configured to wirelessly transmit the second control information;
   wherein the second control information is based on an external current state of an external variable matching circuit, associated with an external device, and an external impedance of the external device; and
   a storage device configured to store impedance characteristic information including a relationship between an impedance characteristic of the power feeding apparatus and an external impedance characteristic of the external device.

2. The power feeding apparatus of claim 1, wherein the first control information is based on a current state of the variable matching circuit and the impedance detected by the impedance detector.

3. The power feeding apparatus of claim 1, wherein the signal transmitter is configured to receive information from the external device including the external current state.

4. The power feeding apparatus of claim 1, wherein the controller is configured to estimate the external impedance based on the impedance characteristic information and the impedance detected by the impedance detector.

5. A power feeding apparatus comprising:
   an impedance detector;
   a controller configured to provide first control information and second control information based on an impedance detected by the impedance detector;

a power transmitter configured to wirelessly transmit power, the power transmitter including a power feeding coil with a variable diameter;

a variable matching circuit configured to change the variable diameter of the power feeding coil according to the first control information; and a signal transmitter configured to wirelessly transmit the second control information, wherein the second control information includes at least one of diameter change information, impedance detection result information, and setting information associated with an external variable matching circuit.

6. A wireless power feeding system comprising:

a power feeding apparatus and a power receiving apparatus, the power feeding apparatus including:

(a) an impedance detector;

(b) a controller configured to provide first control information and second control information based on an impedance detected by the impedance detector;

(c) a power transmitter configured to wirelessly transmit power to the power receiving apparatus, the power transmitter including a first power feeding coil with a first variable diameter;

(d) a first variable matching circuit configured to change the first variable diameter of the first power feeding coil according to the first control information; and (e) a signal transmitter configured to wirelessly transmit the second control information to the power receiving apparatus; and the power receiving apparatus including:

(a) a power receiver configured to wirelessly receive power from the power feeding apparatus, the power receiver including a second power feeding coil with a second variable diameter;

(b) a signal receiver configured to wirelessly receive the second control information from the power feeding apparatus; and (c) a second variable matching circuit configured to change the second variable diameter of the second power feeding coil according to the second control information, wherein the second control information is based on the impedance detected in the power feeding apparatus.

7. The wireless power feeding system of claim 6, wherein the first control information is based on a current state of the first variable matching circuit and the impedance detected by the impedance detector.

8. The wireless power feeding system of claim 6, wherein the second control information is based on a current state of the second variable matching circuit and an impedance of the power receiving apparatus.

9. The wireless power feeding system of claim 8, wherein the signal transmitter is configured to receive information from the power receiving apparatus including the current state of the second variable matching circuit.

10. The wireless power feeding system of claim 8, wherein the power feeding apparatus includes:

a storage device configured to store impedance characteristic information including a relationship between an first impedance characteristic of the power feeding apparatus and a second impedance characteristic of the power receiving apparatus.

11. The wireless power feeding system of claim 10, wherein the controller is configured to estimate the impedance of the power receiving apparatus based on the impedance characteristic information and the impedance detected by the impedance detector.

12. The wireless power feeding system of claim 6, wherein the second control information includes at least one of diameter change information, impedance detection result information, and setting information associated with the second variable matching circuit.

13. The wireless power feeding system of claim 6, wherein the second variable matching circuit changes the second variable diameter of the second power feeding coil independent of detecting an impedance in the power receiving apparatus.

* * * * *